United States Patent
Phillips et al.

(10) Patent No.: US 10,062,522 B1
(45) Date of Patent: Aug. 28, 2018

(54) POWDER-BASED SUPER DIELECTRIC MATERIAL CAPACITOR

(71) Applicant: The United States of America, as represented by the Secretary of the Navy, Washington, DC (US)

(72) Inventors: Jonathan Phillips, Pacific Grove, CA (US); Samuel Salvadore Fromille, IV, Kapolei, HI (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/788,280

(22) Filed: Oct. 19, 2017

Related U.S. Application Data

(63) Continuation-in-part of application No. 15/620,983, filed on Jun. 13, 2017, now Pat. No. 9,870,875, which
(Continued)

(51) Int. Cl.
*H01G 9/022* (2006.01)
*H01G 11/60* (2013.01)
(Continued)

(52) U.S. Cl.
CPC .............. *H01G 11/60* (2013.01); *H01G 4/04* (2013.01); *H01G 4/06* (2013.01); *H01G 4/20* (2013.01);
(Continued)

(58) Field of Classification Search
CPC .... H01G 9/0425; H01G 9/0036; H01G 9/035; H01G 9/145
See application file for complete search history.

(56) References Cited

U.S. PATENT DOCUMENTS

| | | | |
|---|---|---|---|
| 3,138,746 A | 6/1964 | Burger et al. | |
| 3,547,423 A | 12/1970 | Jenny et al. | |

(Continued)

OTHER PUBLICATIONS

Wakai,"How Polar Are Ionic Liquids? Determination of the Static Dielectric Constant of an Imidazolium-based Ionic Liquid by Microwave Dielectric Spectroscopy," J. Phys. Chem. B, vol. 109, No. 36 (2005).

(Continued)

*Primary Examiner* — Dion R Ferguson
(74) *Attorney, Agent, or Firm* — Naval Postgraduate School; James B. Potts

(57) ABSTRACT

A capacitor having first and second electrodes and a scaffold dielectric. The scaffold dielectric comprises an insulating material with a plurality of longitudinal channels extending across the dielectric and filled with a dielectric paste comprising a porous material and an ion-comprising liquid within the pores of the porous material. The plurality of longitudinal channels are substantially parallel and the liquid comprising the dielectric paste generally has an ionic strength of at least 0.1. Capacitance results from the migrations of positive and negative ions in the confined liquid in response to an applied electric field. A method of supplying power to a load using the capacitor and a method of making the capacitor is additionally disclosed.

20 Claims, 9 Drawing Sheets

Related U.S. Application Data is a continuation-in-part of application No. 15/239,039, filed on Aug. 17, 2016, now Pat. No. 10,020,125, which is a continuation-in-part of application No. 14/850,410, filed on Sep. 10, 2015, now Pat. No. 9,711,293, which is a continuation-in-part of application No. 14/624,321, filed on Feb. 17, 2015, now Pat. No. 9,530,574.

(60) Provisional application No. 62/100,789, filed on Jan. 7, 2015, provisional application No. 62/075,039, filed on Nov. 4, 2014.

(51) Int. Cl.

| | |
|---|---|
| H01L 21/3213 | (2006.01) |
| H01G 9/00 | (2006.01) |
| H01G 11/46 | (2013.01) |
| H01G 11/62 | (2013.01) |
| H01G 4/06 | (2006.01) |
| H01G 4/20 | (2006.01) |
| H01G 4/04 | (2006.01) |
| H01B 3/10 | (2006.01) |

(52) U.S. Cl.
CPC .......... *H01G 9/0032* (2013.01); *H01G 9/022* (2013.01); *H01G 9/155* (2013.01); *H01G 11/46* (2013.01); *H01G 11/62* (2013.01); *H01L 21/32133* (2013.01); *H01B 3/10* (2013.01)

(56) References Cited

U.S. PATENT DOCUMENTS

| | | | |
|---|---|---|---|
| 3,700,975 A | 10/1972 | Butherus et al. | |
| 3,903,460 A | 9/1975 | Tsacoyeanes et al. | |
| 5,303,118 A * | 4/1994 | Saito | H01G 9/155 29/25.03 |
| 6,454,816 B1 | 9/2002 | Lee et al. | |
| 6,802,262 B1 | 10/2004 | Warnagiris et al. | |
| 2011/0304953 A1 | 12/2011 | Zhou et al. | |
| 2016/0133391 A1 * | 5/2016 | Navratil | H01G 9/052 361/528 |

OTHER PUBLICATIONS

Sato et al., "Electrochemical properties of novel ionic liquids for electric double layer capacitor applications," Electrochimica Acta 49 (2004).

Lu et al.,"High performance electrochemical capacitors from aligned carbon nanotube electrodes and ionic liquid electrolytes," Journal of Power Sources 189 (2009).

Younesi et al., "Lithium salts for advanced lithium batteries: Li-metal, Li—O2, and Li—S," Energy Environ. Sci.8 (2015).

Bo et al., "Molecular Insights into Aqueous NaCl Electrolytes Confined within Vertically-oriented Graphenes," Sci. Rep. 5 (2015).

Kotz et al,"Principles and applications of electrochemical capacitors," Electrochimica Acta 45 (2000).

Akinwolemiwa et al., "Redox Electrolytes in Supercapacitors," Journal of the Electrochemical Society, 162 (5) (2015).

Conway et al.,"Transition from "Supercapacitor" to "Battery" Behavior in Electrochemical Energy Storage," J. Electrochem. Soc. 138(6) (1991).

Liu et al., "Understanding electrochemical potentials of cathode materials in rechargeable batteries," Materials Today 19(2) (2016).

Chen,"Understanding supercapacitors based on nano-hybrid materials with interfacial conjugation," Progress in Natural Science: Materials International 23(3) (2013).

* cited by examiner

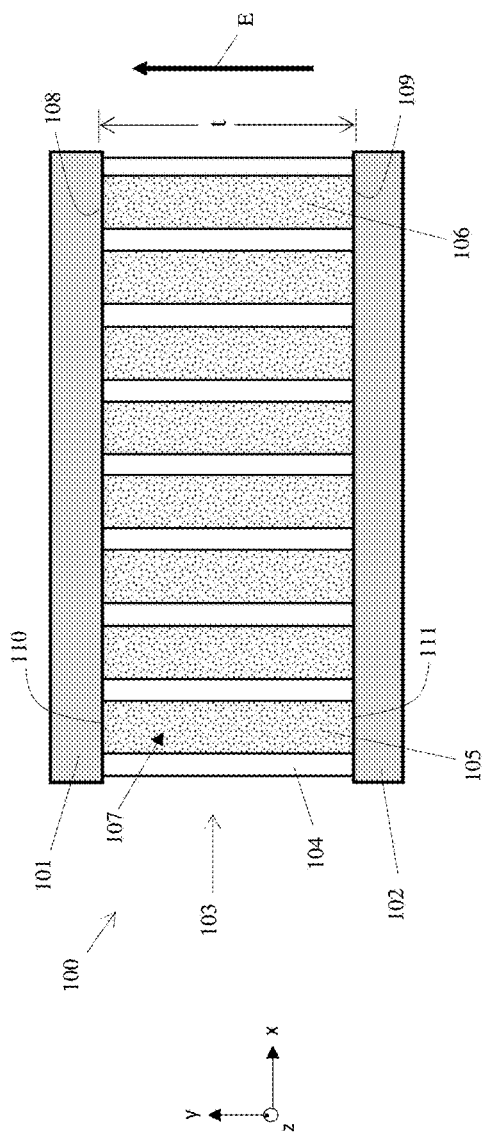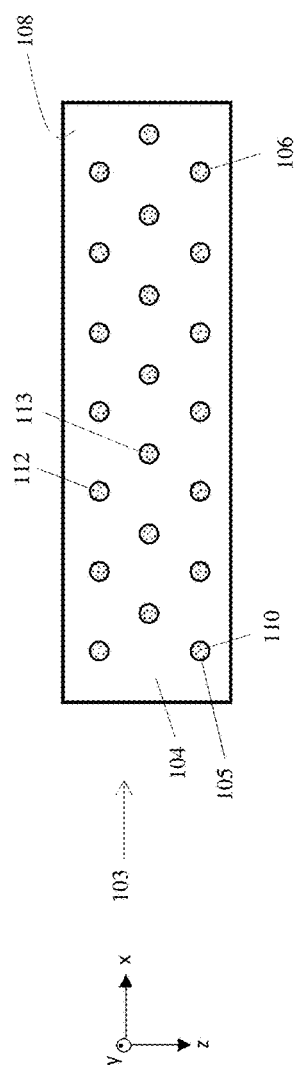
FIG. 1A
FIG. 1B

POWDER-BASED SUPER DIELECTRIC MATERIAL CAPACITOR

RELATION TO OTHER APPLICATIONS

This application claims priority to and the benefit of U.S. application Ser. No. 15/620,983 filed Jun. 13, 2017, which claimed priority to and the benefit of U.S. application Ser. No. 15/239,039 filed Aug. 17, 2016, which claimed priority to and the benefit of U.S. application Ser. No. 14/624,324 now U.S. Pat. No. 9,530,574 filed Feb. 17, 2015, and which further claimed priority to and the benefit of U.S. application Ser. No. 14/850,410 now U.S. Pat. No. 9,711,293 filed Sep. 10, 2015, which claimed priority to and the benefit of U.S. Application No. 62/457,418 filed Feb. 10, 2017, all of which are hereby incorporated by reference in their entirety.

FIELD OF THE INVENTION

The present invention is directed to dielectric materials. In particular the present invention is directed to dielectric materials having high dielectric constants.

BACKGROUND

There are several distinct capacitor technologies, such as super capacitors and traditional electrostatic, also known as 'dielectric', capacitors. Super capacitors increase capacitance by increasing the surface area of the electrically conductive electrode. Most of the volume of a super capacitor is the high surface area electrode, which is basically in powder form. Increasing the super capacitor 'depth' while keeping constant the shape/surface area of the attaching ends, increases the amount of electrode material area and increases the capacitance. Consistent with this paradigm is the recent interest in employing graphene in super capacitors, as graphene is very good for that purpose. Indeed, graphene has very high electrical conductivity and the measured surface of some graphene forms are near the theoretical limit ($\sim$2700 $m^2/gm$). Given that the electrode surface area of graphene in super capacitors is near its theoretical limit, further dramatic energy density increases in these devices is unlikely.

In contrast to the improvements made with super capacitors, there has only been a marginal advance in the last few decades in finding materials with superior dielectric constants for the traditional electrostatic capacitor that is a capacitor built of a single dielectric material with a high dielectric constant sandwiched between two flat conductive electrodes. One clear functional contrast between super capacitors and electrostatic capacitors is the impact of 'depth' or 'thickness'. In an electrostatic capacitor, capacitance increases inversely to the distance between plates. Thus, given plates of a constant size, the thinner an electrostatic capacitor, the greater the capacitance. Therefore in order to improve the performance of this style of capacitor they either have to be made thinner and/or use materials with higher and higher dielectric constants.

SUMMARY

Provided here is a capacitor comprising a first electrode, a second electrode, and a scaffold dielectric between the first and second electrode. The scaffold dielectric comprises an insulating material and a plurality of longitudinal channels extending through the insulating material generally from the first electrode to the second electrode. The scaffold dielectric further comprises a dielectric paste within each longitudinal channel and contacting the first and second electrodes, with the dielectric paste comprising a porous material and an ion-comprising liquid within the pores of the porous material. Typically the liquid within the pores has an ionic strength of at least 0.1 where the ionic strength is a function of the concentration of all cations and anions present. In other embodiments, the liquid is a solution comprising a solvent and a solute with the solute having a molarity of at least 0.1 moles solute per liter of solvent, and in a further embodiment, the solute is a polar liquid having a dielectric constant of at least 5. In some embodiments, the plurality of longitudinal channels is present within a specific volume of scaffold dielectric such that the specific volume has a solid volume fraction of less than 98%, typically less than 80%. Within the capacitor, the cations and anions in the confined liquid of the scaffold dielectric migrate within the ionic solution to create dipoles in response to an applied electric field.

The novel apparatus and principles of operation are further discussed in the following description.

BRIEF DESCRIPTION OF THE DRAWINGS

FIG. 1A illustrates an embodiment of the capacitor disclosed.

FIG. 1B illustrates an embodiment of the scaffold dielectric.

Figure 2:
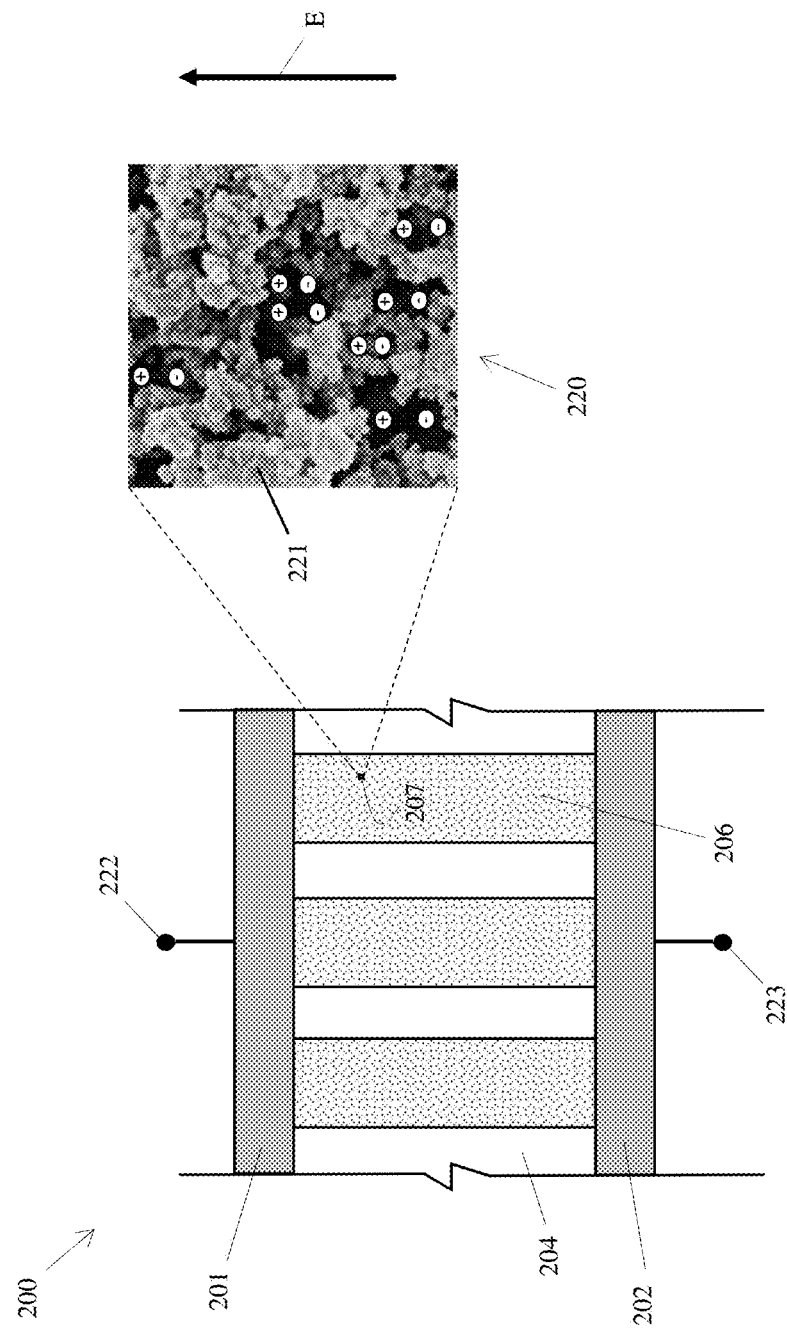
FIG. 2 illustrates another embodiment of the capacitor disclosed.

Embodiments in accordance with the invention are further described herein with reference to the drawings.

DETAILED DESCRIPTION OF THE INVENTION

The following description is provided to enable any person skilled in the art to use the invention and sets forth the best mode contemplated by the inventor for carrying out the invention. Various modifications, however, will remain readily apparent to those skilled in the art, since the principles of the present invention are defined herein specifically to a capacitor utilizing a scaffold dielectric to provide capacitance resulting from migrations of positive and negative ions in a confined ionic solution within the scaffold dielectric.

Provided here is a capacitor comprising a first electrode, a second electrode, and a scaffold dielectric between the first and second electrode. The scaffold dielectric comprises an insulating material having a plurality of longitudinal channels extending through the insulating material between the first and second electrode, with the longitudinal channels filled with a dielectric paste. The dielectric paste maintains a paste-like consistency in operation and comprises a heterogeneous mixture of discrete, porous material particles such as fumed silica and a liquid containing cations and anions. Within the heterogeneous mixture, some portion of the liquid comprising the dielectric paste is within the pores of the porous material. In typical embodiments, the porous material comprising the dielectric paste has a surface area greater than 0.5 m$^2$ of surface/gm of porous material. Within the scaffold dielectric, both the insulating material and the dielectric paste in each channel are in contact with the first electrode and second electrode, and the plurality of channels extending through the insulating material are typically present such that a volume of the scaffold dielectric comprising the insulating material, the plurality of channels, and the liquid has a solid volume fraction of less than about 98%, typically less than 80%. In a typical embodiment, the liquid comprising the dielectric paste within the plurality of longitudinal channels has an ionic strength of at least 0.1 where the ionic strength is a function of the concentration of all cations and anions present in the ionic solution. In another embodiment, the first and second electrode have a surface area <10 m$^2$/gm, in order to minimize interactions with the electrode and increase energy densities within the dielectric paste. In operation and generally, capacitance results from the migrations of positive and negative ions in the confined liquid within the pores of the porous material in response to an applied electric field.

A particular embodiment of a capacitor 100 is generally illustrated at FIG. 1A in accordance with the axes shown. Capacitor 100 comprises a first electrode 101 and a second electrode 102 generally comprised of a conductive material. A scaffold dielectric generally indicated by 103 separates first electrode 101 and second electrode 102, with scaffold dielectric 103 comprising an insulating material 104, a plurality of longitudinal channels such as 105 and 106, and a dielectric paste residing within each longitudinal channel such as that generally indicated by 107. Scaffold dielectric 103 spans a distance t separating first electrode 101 and second electrode 102. FIG. 1B represents an alternate view of scaffold dielectric 103 illustrated in accordance with the indicated axes.

The dielectric paste filling the longitudinal channels is a heterogeneous mixture comprising discrete particles of a porous material and a liquid filling the pores of the porous material. The dielectric is thus a multi-material mixture comprising both liquid and solid, where the solid serves as a physical framework or skeleton holding the polarizable elements in place, and mobile ions in a liquid solution provide the polarizable element. For example, FIG. 2 illustrates a section of a capacitor 200 illustrating first electrode 201, second electrode 202, insulating material 204, and longitudinal channel 206, with a portion of dielectric material 207 within longitudinal channel 206 shown in expanded view as 220. 220 illustrates a porous material 221 having pores illustrated with the darker areas within 220, and a liquid comprising cations and anions filling the pores of porous material 221. A voltage is applied across electrodes 201 and 202 via leads 222 and 223 respectively, resulting in an electric field E generated from electrode 202 to electrode 201. In response to the electric field E, positive ions+ and negative ions− in the liquid within the pores of porous material 222 migrate to create dipoles. Generally, the created dipoles have length dependent on a liquid-filled pore diameter. In each liquid-filled pore volume, dipoles oppose the applied field E resulting in a decrease in the net field. As more charges are added the dipoles grow larger, hence the net field grows slowly. This ion separation greatly increases the effective dielectric constant of the scaffold dielectric located between first capacitor electrode 201 and second capacitor electrode 202, and greatly increases the amount of charge that can be stored in capacitor 200 as compared to conventional capacitors of the same physical size.

In typical embodiments, the pores of porous material 221 have a mean pore diameter between 1-20,000 Å, and in other embodiments have a mean pore diameter between 1-200,000 Å. In other embodiment, porous material 221 is a media having a porosity of at least 50%. In some embodiments, porous material 221 comprises an oxide such as alumina, silica, titania, magnesia, and other metal oxides. However, porous material 221 may comprise any material having characteristics as disclosed herein, including fabrics, fibers, sponges, polymer materials such as nylon, and others. In further embodiments, the liquid within the pores of porous material 221 has an ionic strength of at least 0.1 where the ionic strength is a function of the concentration of all cations and anions present in the liquid. In other embodiments, the liquid comprises a solvent and a solute and the solute has a molarity of at least 0.1 moles solute per liter of solvent, and in a further embodiment, the solute is a polar liquid having a dielectric constant of at least 5. In a typical embodiment, the liquid is an aqueous solution and the solute is a salt, an acid, or a base. The insulating material 204 typically has an electrical conductivity of less than about $10^{-8}$ S/cm.

In embodiments, the mass of the liquid comprising the dielectric paste has a volume of at least 30 wt. %, more typically 50 wt. %, and more typically 70 wt. % of the pore volume of the porous material comprising the dielectric paste. Pore volumes can be determined based on information provided by a manufacturer or using means well known the art, such as BET isotherm analysis, mercury porosimetry, evapoporometry, and others. See e.g. S. Lowell et al., *Characterization of Porous Solids and Powders: Surface Area, Pore Size and Density* (2004), among many others. In typical embodiments, the liquid is present in the dielectric paste in an amount such that the dielectric paste is a viscoplastic, non-newtonian fluid which behaves as a solid until a sufficiently large stress is applied to the dielectric paste. In typical embodiments, the dielectric paste exhibits rheology associated with a Bingham plastic. Generally the specific liquid filling the pores is also present outside the pores and substantially coating the exterior surfaces of the porous material, and the specific liquid substantially serves as a background fluid while individual porous material particles interact to form a disordered, glassy or amorphous structure. The dielectric paste made be prepared by any impregnation method which results in some portion of the liquid filling the pores of the porous material, including physical mixing to the general point of incipient wetness. In typical embodiments, the pores comprising the porous solid are at least 10%, or at least 25%, of at least 50% filled with the liquid by volume. Pore fills may be determined using means known in the art, such as TEM tomography, differential scanning calorimetry (DSC), and others. See e.g., Munnik et al., "Recent Developments in the Synthesis of Supported Catalysts," *Chem. Rev.* 115 (2015), among others.

Capacitor 100 differs significantly from typical energy storage devices utilizing liquids as an inherent component. For example, capacitors known generally as electrolytic capacitors generally utilize an oxide film as the dielectric with a liquid electrolyte serving as an extension of one electrode, and a liquid electrolyte is typically in contact with only the one electrode and the dielectric oxide layer, as opposed to dielectric paste 107 in contact with both electrodes as in capacitor 100. Similarly, electric double-layer capacitors (EDLC) rely on electrostatic storage achieved by separation of charge in a Helmholtz double layer at the interface between the surface of a conductor electrode and an electrolytic solution, with the two layers of ions at the interface acting like a dielectric in a conventional capacitor. The double layer thickness is generally a material property of the electrode, and correspondingly increases in capacitance generally require increases in the specific surface area of the electrode. Graphene having surface areas in excess of 1000 m²/gm are typically utilized in order to generate the double layer over a wide area. In contrast and in certain embodiments, capacitor 100 utilizes electrode materials having specific surface areas less than about 10 m²/gm in order to minimize interactions with the electrode and increase energy densities within dielectric paste 107. Additionally, capacitor 100 differs significantly from devices such as those known generally as pseudo-capacitors and capacitor batteries, which rely on redox activity between an electrolyte and electrode, or an intercalaction/deintercalation process where electrolyte ions undergo reversible inclusion into electrode materials having layered structures. Typically and in certain embodiments, the positive and negative ions of dielectric paste 107 in capacitor 100 do not comprise atoms or molecules of the majority materials comprising at least first electrode 101 or at least second electrode 102, and redox or intercalation processes remain substantially absent.

At FIGS. 1A and 1B, insulating material 104 has a first side 108 and a second side 109, with first side 108 in contact with first electrode 101 and second side 109 in contact with second electrode 102 across the distance t. The plurality of longitudinal channels such as 105 and 106 extend from first side 108 to second side 109 of insulating material 104, such that each longitudinal channel forms a first aperture in first side 108 of insulating material 104 and a second aperture in second side 109 of insulating material 104. For example, at FIG. 1A, longitudinal channel 105 extends through insulating material 104 from first side 108 to second side 109 and comprises first aperture 110 in first side 108 and second aperture 111 in second side 109. First aperture 110 of longitudinal channel 105 is additionally shown at FIG. 1B with respect to insulating material 104 and first side 108. Longitudinal channel 106 is also shown for reference, as well as additional members of the plurality of longitudinal channels such as 112 and 113. In an embodiment, the plurality of longitudinal channels comprises scaffold dielectric 104 such that a 1 cm² area of scaffold dielectric 103 comprising some portion of first side 108 includes at least 10 first apertures per cm² of area, and similarly such that a 1 cm² area of scaffold dielectric 103 comprising some portion of second side 109 includes at least 10 second apertures per cm² of area. In another embodiment, the plurality of longitudinal channels comprises scaffold dielectric 103 such that insulating material 104 has a solid volume fraction of less than about 98%, and in a further embodiment, less than about 80%. In other embodiments, capacitor 100 has a sufficient quantity of first apertures to generate a percent effective area of at least 10%, in some embodiments at least 30%, and in other embodiments at least 60%, where the percent effective area is the combined area in cm² of all first apertures in first side 108 over a 1 cm² area of first side 108, multiplied by 100%.

Figure 3:
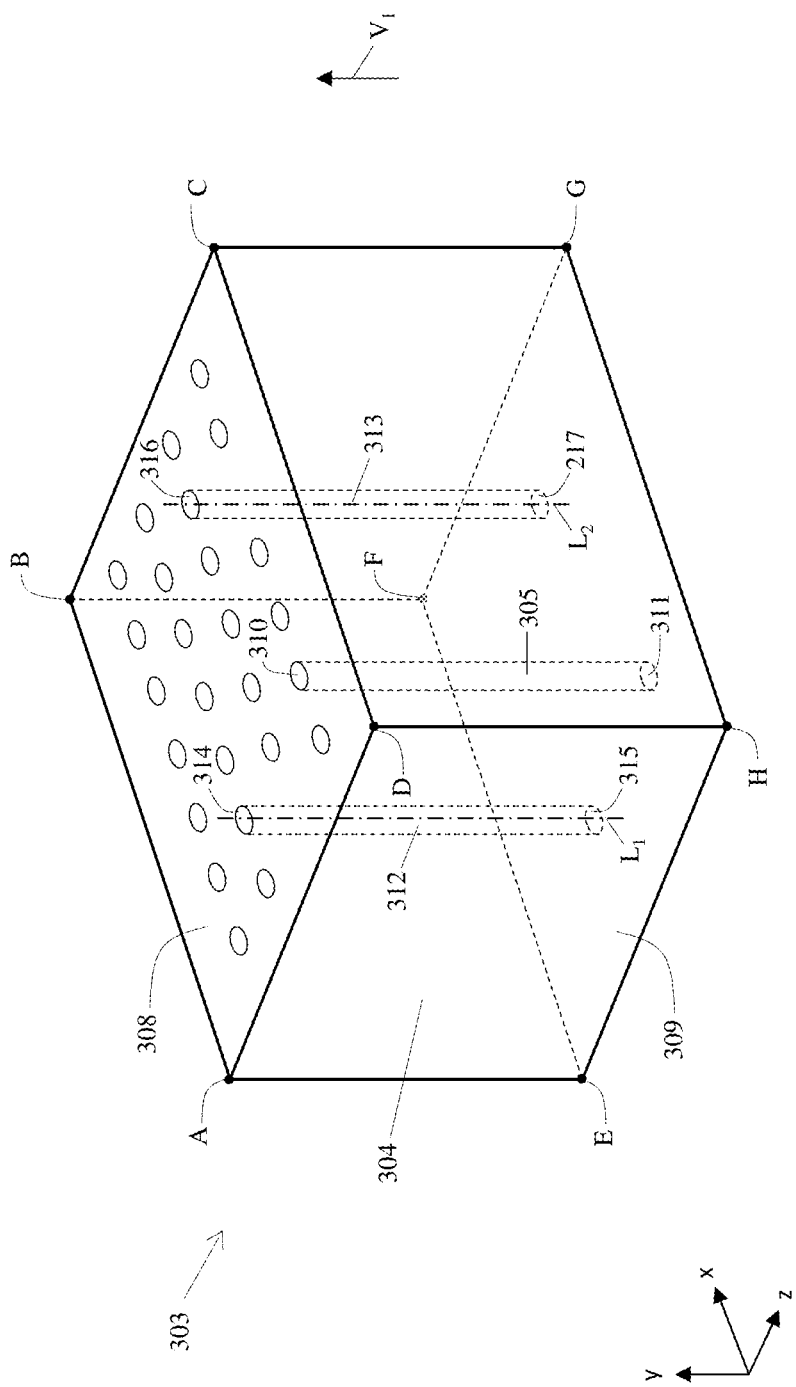
FIG. 3 illustrates another embodiment of the scaffold dielectric.

As further example, FIG. 3 illustrates a volume of scaffold dielectric 303 bounded by points A, B, C, D, E, F, G, and H and in accordance with the axes shown. Scaffold dielectric 303 comprises insulating material 304 comprising first side 308 enclosed within the boundary A-B-C-D and second side 309 enclosed within the boundary E-F-G-H. Scaffold dielectric 303 further comprises a plurality of longitudinal channels, exemplified by longitudinal channel 305, which extends from first side 308 to second side 309. Each longitudinal channel comprises a first and second aperture on the respective sides, exemplified by first aperture 310 of longitudinal channel 305 on first side 308 and second aperture 311 of longitudinal channel 305 on second side 309. Additionally illustrated for reference is longitudinal channel 312 comprising first aperture 314 and second aperture 315, and longitudinal channel 313 comprising first aperture 316 and second aperture 317. The first and second apertures are in fluid communication with each other through the longitudinal channel. Further at FIG. 2, the boundary A-B-C-D surrounds an area of scaffold dielectric 303 comprising at least some portion of first side 308 of insulating material 303, and the boundary E-F-G-H surrounds an additional area of scaffold dielectric 303 with the additional area comprising at least some portion of second side 309 of insulating material 303. A specific volume of scaffold dielectric 303 comprising some portion of first area 308, some portion of second area 309, and the plurality of longitudinal channels, is bounded by A-B-C-D-E-F-G-H. In certain embodiments, the plurality of longitudinal channels is present within a specific volume of scaffold dielectric 303 comprising some portion of first area 308, some portion of second area 309, and the plurality of longitudinal channels such the specific volume has a solid volume fraction of less than 98%. Here, the solid volume fraction is equal to $(1-V_I/V_D) \times 100\%$, where $V_D$ is the specific volume of the scaffold dielectric such as that bounded by A-B-C-D-E-F-G-H, and $V_I$ is the volume of insulating material within the specific volume such as A-B-C-D-E-F-G-H. In other embodiments, the volume of scaffold dielectric 303 has a solid volume fraction of less than 90%, in other embodiments less than 80%, and in further embodiments less than 50%.

In further embodiments, the plurality of longitudinal channels are substantially parallel. Here, "substantially parallel" means that every longitudinal channel has a longitudinal axis extending through its first aperture and second aperture, and that further there is a particular direction vector for which an angle between the particular direction vector and every longitudinal axis is less than less than 30 degrees, less than 15 degrees, or less than 5 degrees. For example at FIG. 3, longitudinal channel 312 has a longitudinal axis $L_1$ and longitudinal channel 313 has a longitudinal axis $L_2$, and $L_1$ and $L_2$ are substantially parallel to the particular direction vector $V_1$. When the plurality of longitudinal channels are substantially parallel, every longitudinal channel in the plurality has an analogous longitudinal axis and the angle between each longitudinal axes and the particular direction vector $V_1$ is less than 30 degrees, less than 15 degrees, or less than 5 degrees.

In additional embodiments, the boundary A-B-C-D of FIG. 3 surrounds a 1 cm² area of scaffold dielectric 303 with the 1 cm² area comprising at least a portion of first side 308 of insulating material 303, and the 1 cm² area comprises at least 10 first apertures. Similarly, the boundary E-F-G-H surrounds an additional 1 cm² area of scaffold dielectric 303 with the additional 1 cm² area comprising at least a portion of second side 309 of insulating material 303, and the additional 1 cm² area comprises at least 10 second apertures.

The liquid comprising dielectric paste 107 may be any liquid comprising ions. As discussed, in certain embodiments liquid of dielectric paste 107 has an ionic strength of at least 0.1, where the ionic strength is a function of the concentration of all cations and anions present in the liquid. In some embodiments, the ions comprising the liquid comprise cations and anions and the cations have an ionic concentration of at least 0.1 moles per liter of liquid and the anions have an ionic concentration of at least 0.1 moles per liter of liquid. See IUPAC, *Compendium of Chemical Terminology* (the "Gold Book") ($2^{nd}$, 1997). In other embodiments, the liquid is a solution comprising a solvent and a solute and the solute has a molarity of at least 0.1 moles solute per liter of solvent. In another embodiment, the solute is a polar liquid having a dielectric constant of at least 5, preferably at least 15, and in a further embodiment the solute is a salt, acid, base, or mixtures thereof. Here, "salt" includes nitrates, nitrides, carbides, alkali halides, metal halides and other crystal structures that dissolve in water to create dissolved ions. In certain embodiments, the solvent of the liquid comprising dielectric paste 107 is saturated with the solvent to at least a 1% saturation, and in other embodiments at least 10%. In another embodiment, the solvent is water and the liquid is an aqueous solution. Additionally, the liquid may comprise an organic solvent, containing an electrolyte selected from an acid, a base, and a neutral salt. Also, the liquid may be a liquid such as those found in acid or base solutions, salt solutions, other electrolytic solutions or ionic liquids of any kind. As disclosed herein, the liquid comprising ions may be any liquid or mixture of liquids, solvents, solutes and the like which provide ions in a liquid as described. See e.g. Gandy et al., "Testing the Tube Super Dielectric Material Hypothesis: Increased Energy Density Using NaCl," *J. Electron. Mater.* 45 (2016); see also Quintero et al., "Tube-Super Dielectric Materials: Electrostatic Capacitors with Energy Density Greater than 200 J·cm-3," *Materials* 8 (2015); See Also Fromille et al., "Super Dielectric Materials," Materials 7 (2014); see also Quintero et al., "Super Dielectrics Composed of NaCl and $H_2O$ and Porous Alumina," J. Electron. Mater. 44 (2015); see also Jenkins et al., "Investigation of Fumed Aqueous NaCl Superdielectric Material," *Materials* 9 (2016); see also Phillips et al., "Novel Superdielectric Materials: Aqueous Salt Solution Saturated Fabric," *Materials* 9 (2016); see also U.S. Pat. No. 9,530,574 issued to Phillips et al., issued Dec. 27, 2016; see also U.S. patent application Ser. No. 15/239, 039 filed by Phillips et al., filed Aug. 17, 2016; and see Clayton W. Petty, "Powder-based superdielectric materials for novel capacitor design," (M.S.thesis, Naval Postgraduate School, 2017).

The plurality of longitudinal channels may comprise any group of channels extending through the scaffold dielectric as described. The longitudinal channels may be present within insulating material 104 as result of a manufacture or fabrication, or may arise within insulating material 104 as a result of natural processes. In a particular embodiment, each longitudinal channel in the plurality has a first aperture and second aperture, with the first aperture in fluid communication with the second aperture. Further, the plurality of longitudinal channels may comprise first and second apertures having any mean diameter, such that the first and second apertures may be characterized as micropores (diameter<2 nm), mesopores (2≤nm≤diameter≤50 nm), macropores (diameter>50 nm), or some combination. Typically the mean diameter is less than 1 mm, and may be greater than, equal to, or less than the distance t of FIG. 1A. The mean pore diameter may be known as a result of a specific manufacture, for example, use of a punch press or like device having a punch of a specific diameter, or may otherwise be determined using means known in the art such as scanning electron microscopy, transmission electron microscopy, bubble point methods, mercury porosimetry, thermoporometry, permporometry, adsorption/desorption methods, and the like. See e.g., Stanley-Wood et al., *Particle Size Analysis* (1992), among others.

Insulating material 104 may be any material having a plurality of longitudinal pores where dielectric paste 107 may reside. In an embodiment, insulating material 104 comprises a constituent material having a conductivity less than $10^{-8}$ S/cm. In other embodiments, the constituent material comprises at least 5 wt. %, at least 50 wt. %, at least 70 wt. %, or at least 90 wt. % of insulating material 104. As used here, "constituent material" may describe a material of singular composition or a combination of materials having different compositions. In further embodiments, insulating material 104 has a conductivity less than $10^{-8}$ S/cm. In some embodiments, insulating material 104 comprises a polymer material having the characteristics as disclosed herein. Generally, "polymer" means a naturally occurring or synthetic compound consisting of large molecules made up of a linked series of repeated simple monomers. Exemplary polymers include those known as Low-density polyethylene (LDPE), High-density polyethylene (HDPE), Polypropylene (PP), Polyvinyl Chloride (PVC), Polystyrene (PS), Nylon, nylon 6, nylon 6,6, Teflon (Polytetrafluoroethylene), Thermoplastic polyurethanes (TPU), and others. In some embodiments, insulating material 104 comprises an oxide such as alumina, silica, titania, magnesia, and other metal oxides. However, porous material 104 may comprise any material having characteristics as disclosed herein, including fabrics, fibers, sponges, polymer materials such as nylon, and other materials. Dielectric paste 107 may be placed in the plurality of longitudinal channels using any effective means known in the art, including brushing, spraying, direct immersion, various pressure and vacuum methods, and others.

First electrode 101 and second electrode 102 may be any conducting material. In a particular embodiment, first electrode 101 and second electrode 102 comprise a conductive material having conductivity greater than $10^3$ S/cm. In certain embodiments, first electrode 101 comprises a first conductive material having conductivity greater than $10^3$ S/cm and the first conductive material comprises at least 50 weight percent (wt. %), at least 70 wt. %, or at least 90 wt. % of first electrode 101, and in further embodiments, second electrode 102 comprises a second conductive material having a conductivity greater than $10^3$ S/cm and the second conductive material comprises at least 5 wt. %, at least 50 wt. %, at least 70 wt. %, or at least 90 wt. % of second electrode 102. As used here, "conductive material" may describe a material of singular composition or a combination of materials having different compositions. In further embodiments, first electrode 101 and second electrode 102 have a conductivity greater than $10^3$ S/cm. Additionally, although represented as substantially planer elements in FIGS. 1A and 1B, first electrode 101, second electrode 102, and scaffold dielectric 103 may be planar, curved, or some combination, and capacitor 100 may have any shape including spiral wound or parallel plate provided the requirements of this disclosure are met.

As discussed, capacitor 100 differs significantly from typical devices utilizing liquids as energy storage or delivery components. For example, unlike electrolytic capacitors and among other distinctions, capacitor 100 utilizes a dielectric paste in contact with both first electrode 101 and second electrode 102. Similarly, unlike a high specific surface area EDLC, capacitor 100 generally relies on large induced electric dipoles formed within the liquid comprising dielectric paste 107 in order to enable maximum energy densities and dielectric values, as opposed to separation of charge in a Helmholtz double layer at an electrode/electrolyte interface. In certain embodiments, capacitor 100 utilizes electrode materials having specific surface areas less than about 10 m$^2$/gm in order to minimize interactions with the electrode and increase energy densities within dielectric paste 107. Capacitor 100 also has a substantial absence of electrochemical activity among the ions of the liquid comprising dielectric paste 107, the first electrode 101, and the second electrode 102, and differs significantly from devices that rely on redox or other electrochemical activity between an electrolyte and electrode. In certain embodiments, the redox potentials among the components are sufficiently similar such that first electrode 101 has a first redox potential $E_1^0$ under standard conditions, the positive ion of the liquid comprising dielectric paste 107 has a positive ion redox potential $E_+^0$ under standard conditions, and the negative ion of the liquid comprising dielectric paste 107 has a negative ion redox potential $E_-^0$ under standard conditions, and an absolute value of $E_+^0$ divided by $E_1^0$ is greater than 0.9, in some embodiments greater than 0.95, and in other embodiments greater than 0.99. In other embodiments, second electrode 102 has a second redox potential $E_2^0$ under standard conditions, and an absolute value of $E_+^0$ divided by $E_2^0$ is greater than 0.9, in some embodiments greater than 0.95, and in other embodiments greater than 0.99. In other embodiments, an absolute value of $E_-^0$ divided by $E_1^0$ is greater than 0.9, in some embodiments greater than 0.95, and in other embodiments greater than 0.99, and in other embodiments, an absolute value of $E_-^0$ divided by $E_2^0$ is greater than 0.9, in some embodiments greater than 0.95, and in other embodiments greater than 0.99. Capacitor 100 also generally experiences an absence of positive or negative ions undergoing reversible inclusions into electrode materials through intercalaction/deintercalation processes. In certain embodiments, the positive ions and negative ions of the liquid of dielectric paste 107 are not ions of an atom or molecule comprising the first conductive material comprising first electrode 101, and in other embodiments, the positive ions and negative ions of the liquid of dielectric paste 107 are not ions of an atom or molecule comprising the second conductive material comprising second electrode 102. Typically the same conductive material is used for both electrodes and, at all stages of charge and discharge, the electrodes remain substantially identical to each other.

The disclosure further provides a method of supplying power to a load using the capacitor disclosed. The method comprises applying a first voltage to the first electrode and a second voltage to the second electrode, where a difference between the second voltage and the first voltage is less than a breakdown voltage of the liquid comprising the dielectric paste, and generating a charged capacitor. The method further comprises electrically connecting the charged capacitor to the load and discharging the charged capacitor to the load, thereby supplying power to the load.

The disclosure additionally comprises a method of making the capacitor disclosed, comprising preparing a dielectric paste, and contacting the dielectric paste and the first side of the insulating material for a sufficient time to allow some portion of the dielectric paste to enter and fill the plurality of longitudinal channels between the first aperture and the second aperture of every longitudinal channel. The method further comprises contacting the first side of the insulating material and the first electrode, contacting the second side of the insulating material and the second electrode, and contacting the dielectric paste within each longitudinal channel with the first electrode and second electrode, in order to place the first and second side of the insulating material in contact with the first and second electrode respectively, and in order to place the dielectric paste in contact with the first electrode and the second electrode, thereby generating a pre-pressed structure. The method further comprises compressing the pre-pressed structure using a compressive force to displace the first electrode toward the second electrode and place the first side of the insulating material in contact with the first electrode and the second side of the insulating material in contact with the second electrode, and place the dielectric paste in contact with the with the first electrode and the second electrode through the every single longitudinal channel in the plurality of longitudinal channels, as disclosed. In a particular embodiment, the method further comprises utilizing a particular material for the insulating material where the particular material comprises constituent material having a conductivity less than 10$^{-8}$ S/cm, and utilizing a particular liquid for the liquid where the particular liquid has an ionic strength of at least 0.1. As previously discussed, contacting the dielectric paste and the first side of the insulating material may be accomplished using any effective means known in the art, including brushing, spraying, direct immersion, various pressure and vacuum methods, and others.

Description of Specific Embodiments

Capacitors were created using a thin polymer sheet and dielectric paste inserted between electrodes of very small thickness. The dielectric paste was fumed silica saturated with a 30 wt. % NaCl salt solution; the result was material with gel-like physical consistency. Each capacitor configuration used a varying number and size of holes in the plastic sheet insulating material plastic to create a variable "Percent Effective Area" (PEA) seen from the top electrode to the bottom. The plastic sheet was cut to a slightly larger size than the electrodes to help prevent edges of the electrodes from touching each other and shorting the circuit. In total, there were a total of five hole-pattern configurations tested. Each hole pattern tested had a relative percentage of the total electrode surface area "exposed." That is, the holes in the membrane represent the effective surface area seen that can act as a capacitor. Because the electrodes for all cases were cut to 2.0 cm×2.0 cm squares, the "Percent Effective Area" tabulated gives the proportion of open hole area to the effective 4.0 cm$^2$ total electrode area. Table 1 lists the different patterns used during experimentation.

The insulating material used was CELGARD PP1615 Microporous Membrane. A laser cutter was used to make precise cuts through the CELGARD PP1615 Microporous Membrane in the hole arrangement and dimensions given in Table 1. Additionally, 2.0 cm×2.0 cm square electrodes were cut from GRAFOIL, a commercially available paper-like material comprised primarily of graphite flakes.

Figure 4:
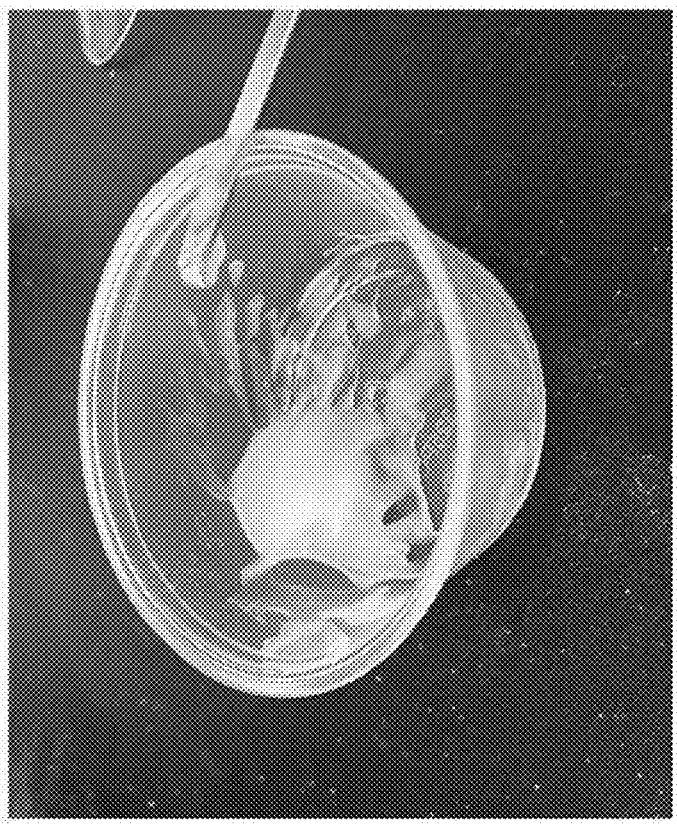
FIG. 4 illustrates an embodiment of the dielectric paste.

The dielectric paste was generated by mixing 1.38 g of sodium chloride (SIGMA-ALDRICH 10 mesh anhydrous beads, 99.999% NaCl, St. Louis, Mo., USA), 5.40 g DI H2O, 0.61 g Fumed Silica (SIGMA-ALDRICH, 0.007 μm avg. particle size, St. Louis, Mo., USA). This ratio qualified the fumed silica, a very hygroscopic material, to have reached a point of incipient wetness. After mixing, the dielectric paste appeared as depicted in FIG. 4.

Figure 6:
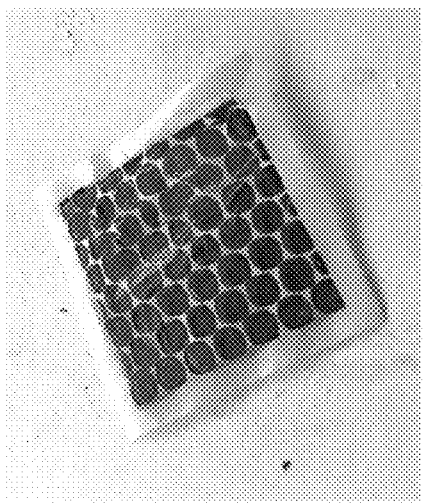
FIG. 6 illustrates another embodiment of the dielectric paste and insulating material.
Figure 5:
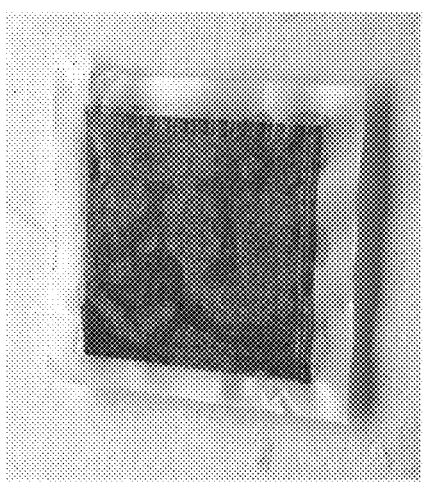
FIG. 5 illustrates an embodiment of the dielectric paste and insulating material.

A light coating of the dielectric paste was applied to the bottom of one of the 2 cm×2 cm GRAFOIL electrodes. Then, the appropriate CELGARD membrane with holes cut was laid on top. An example with ~5900 holes is illustrated at FIG. 5 and an example with ~56 holes in the FCC configuration is illustrated at FIG. 6. The top electrode was placed in contact with the insulating material and dielectric gel and a small 5.0 gram weight was gently placed across the top electrode to evenly squeeze and remove any dielectric paste from the capacitor to ensure a uniform thickness on the order of the thickness of the membrane.

Once the capacitor has been fully assembled, leads were place on top and bottom before being sandwiched between two glass slides which were held together by two small binder clips on either end. Tissue paper was wetted with DI water to help maintain relative humidity in the test chamber and to prevent excessive deflection of the glass slides. This setup ensured good compression on the capacitor to ensure uniform thickness across the entire area. A BIO-LOGIC VSP 300 system was used in conjunction with EC-LAB V11.02 software in order to conduct tests of the various capacitor designs. The technique settings followed the parameters listed in Table 2 which each capacitor was run according to these parameters. All capacitors, in all cases, were charged to a maximum voltage of 2.3 V before being allowed to discharge.

Figure 7:
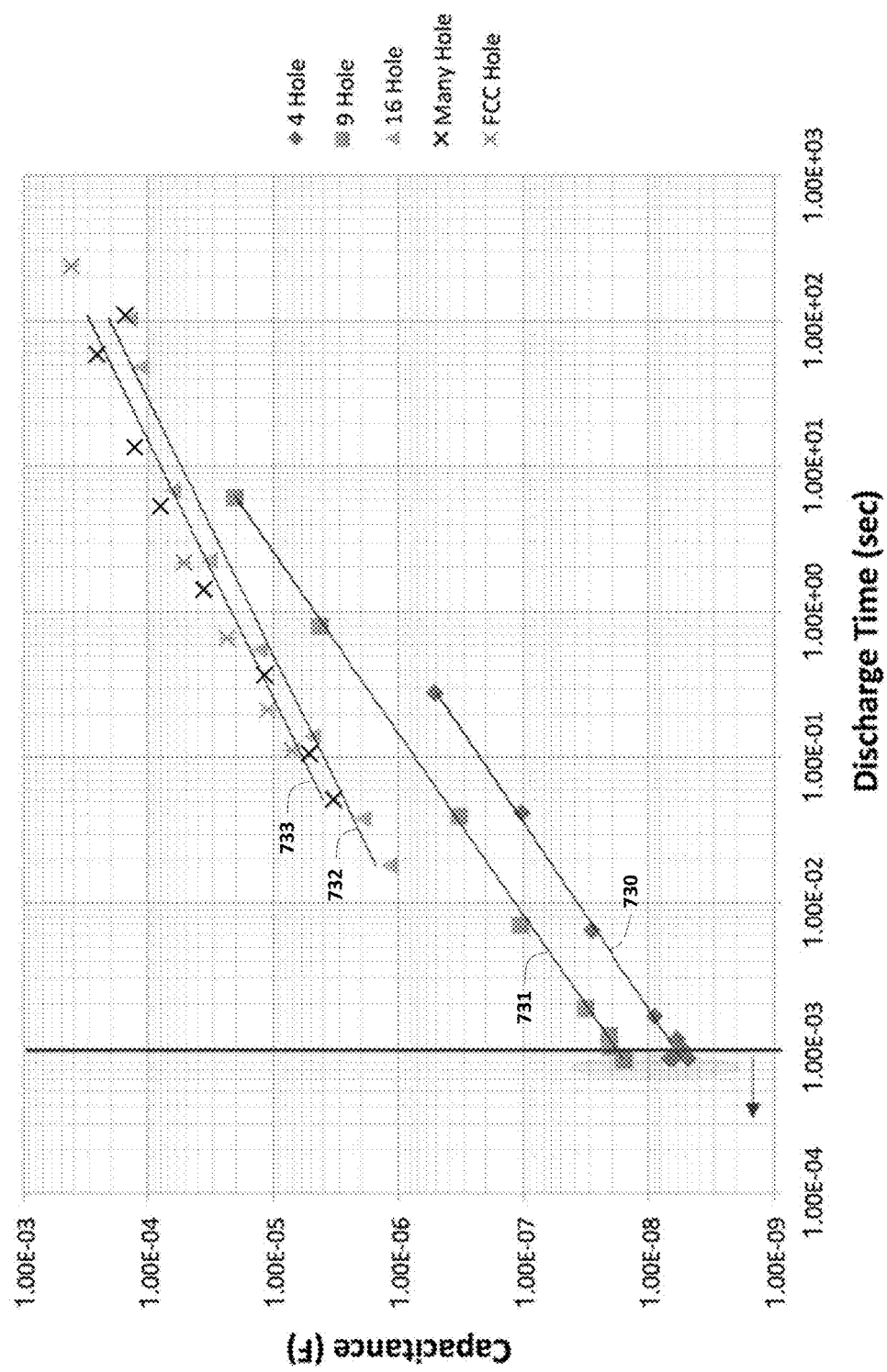
FIG. 7 illustrates the capacitance of several embodiments.

Capacitance results calculated below an 0.8 V threshold are illustrated at FIG. 7 with 730, 731, 732, and 733, illustrating the 4 hole, 9 hole, 16 hole, and many hole/FCC hole capacitors respectively. A greater PEA leads to a higher capacitance at all discharge times. Also, longer discharge times also generally yield higher capacitance values in a given capacitor design. Note also that the "roll off" with decreasing discharge time curves are nearly parallel to the 4 and 6 hole cases but less sharp for the three capacitors with higher PEA values.

Figure 8:
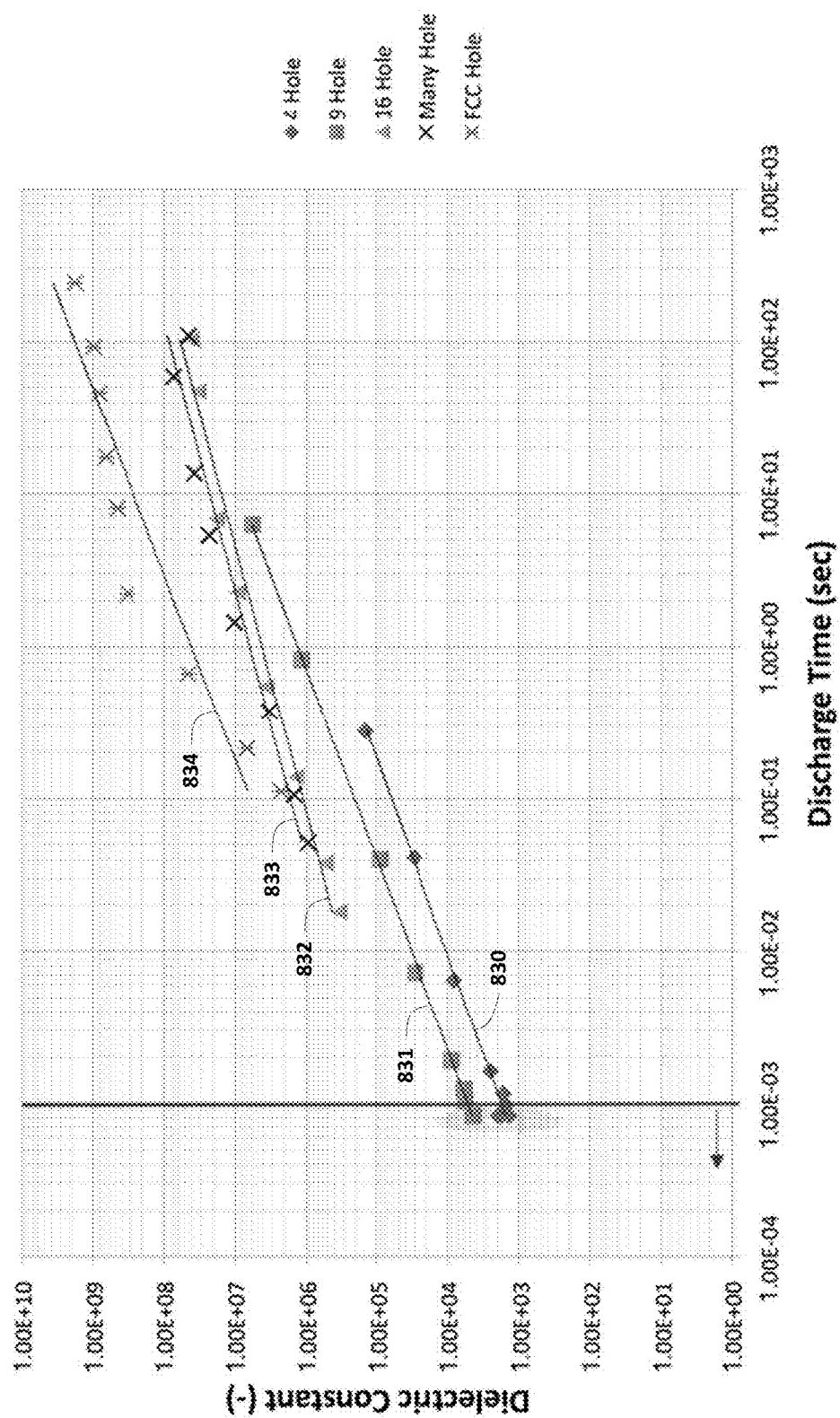
FIG. 8 illustrates the dielectric constant of several embodiments.

FIG. 8 illustrates dielectric constant results with 830, 831, 832, 833, and 834 illustrating the 4 hole, 9 hole, 16 hole, many hole, and FCC hole capacitors respectively. Greater PEA demonstrates dielectric values across discharge times, while longer discharge times also generally yield higher dielectric values in a given capacitor design. The dielectric constants were only determined below 1 volt, reflecting the fact that capacitance and dielectric constant decrease with voltage above ~1 volt. The roll-off for each type of capacitor is very linear, providing evidence that the data is "intentionally consistent."

Figure 9:
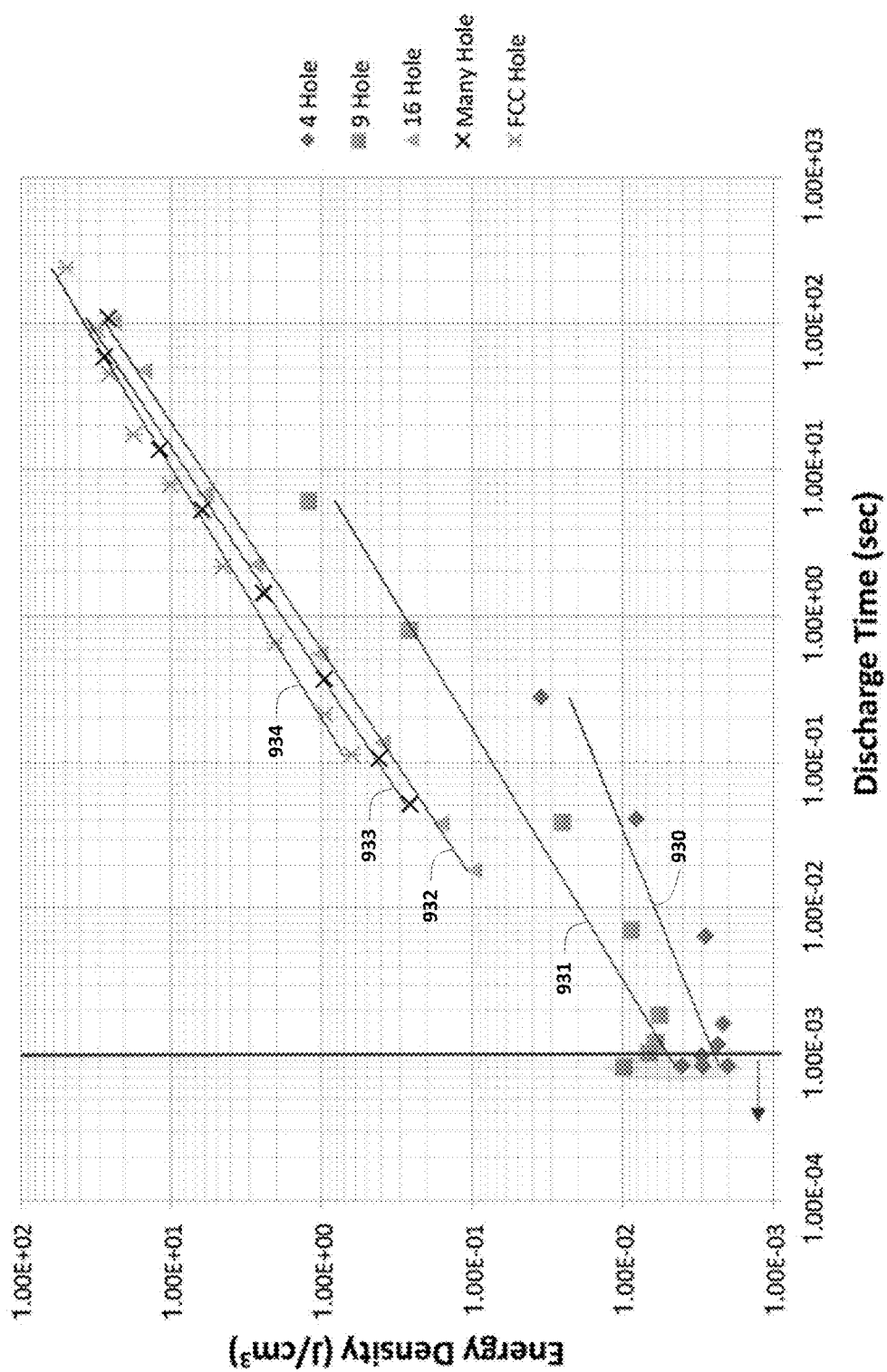
FIG. 9 illustrates the energy density of several embodiments.

Energy density results were calculated based on the integrated area under the voltage vs. time discharge graph for each capacitor being cycled and illustrated at FIG. 9 with 930, 931, 932, 933, and 934 illustrating the 4 hole, 9 hole, 16 hole, many hole, and FCC hole capacitors respectively.

Figure 10:
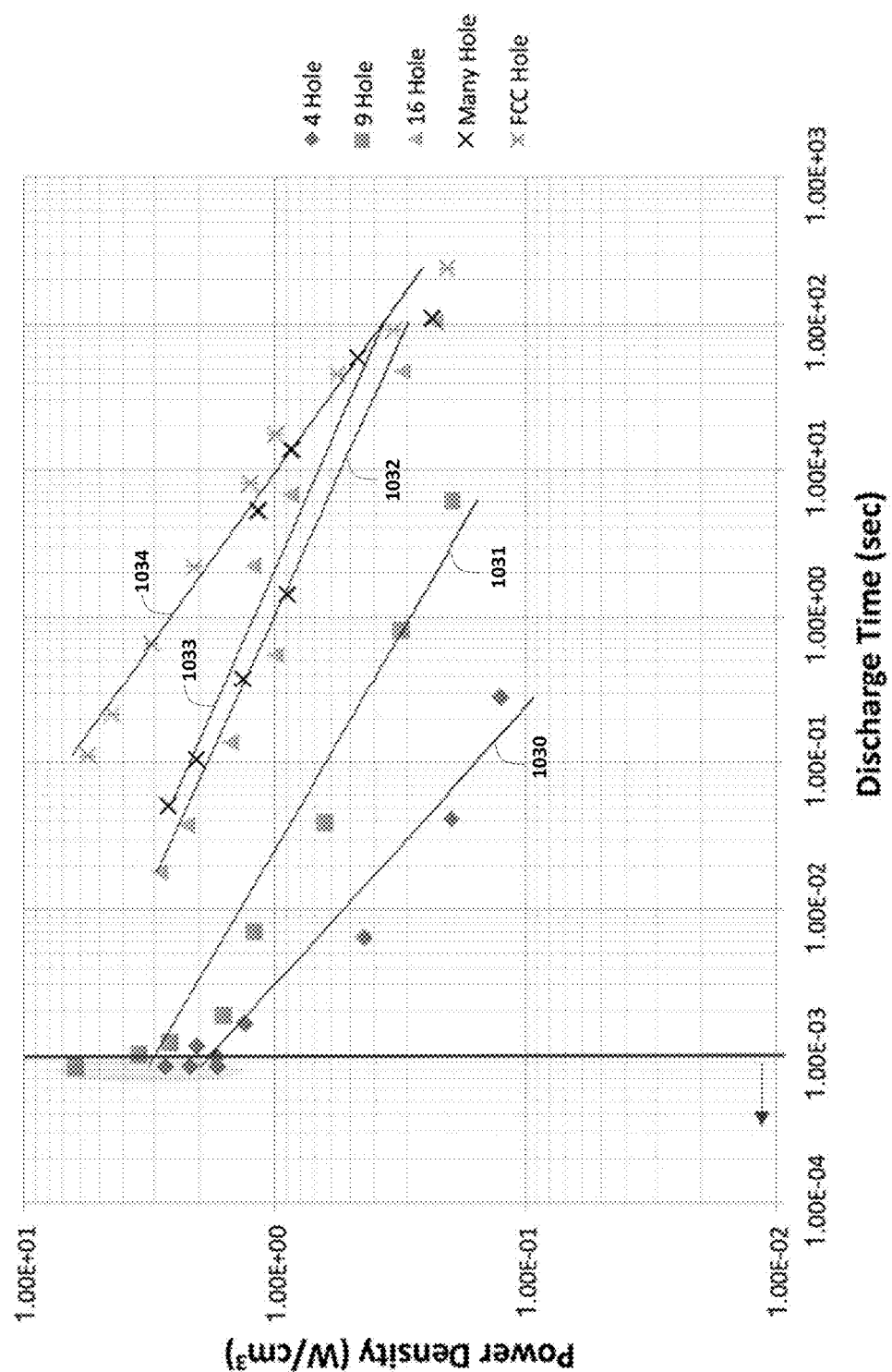
FIG. 10 illustrates the power density of several embodiments.

Power density results were calculated based diving the energy density values by the average discharge time, giving energy density per time (power). Results are illustrated at FIG. 10 with 1030, 1031, 1032, 1033, and 1034 illustrating the 4 hole, 9 hole, 16 hole, many hole, and FCC hole capacitors respectively. Longer discharge times inhibit power density performance among capacitors of the same design. Shorter discharge times (i.e., higher frequencies) reveal better power densities across all hole configurations. The trends illustrated and extrapolated to very short discharge times reveal potentially astonishing power density values (i.e., >100 W/cm3).

Generally, thin Powder-based Superdielectric Material capacitors demonstrate that they are in fact feasible capacitor configurations for high energy density storage. Specifically, results were shown to successfully fabricate a variety of thin capacitors with very thin films of aqueous NaCl solution saturated silica gel films spread within holes of a very thin (16 μm) polymer sheet. With variance in the given "effective area" per capacitor configuration, improved overall performance is achievable in all four primary capacitor metrics: capacitance, dielectric constant, energy density and power density.

Thus provided here is a capacitor having a first electrode, a second electrode, and a scaffold dielectric between the first and second electrode, where the scaffold dielectric comprises an insulating material with a plurality of longitudinal channels filled with a dielectric paste comprising a porous material and an ion-comprising liquid. Typically the insulating material and the dielectric paste in each channel are in contact with the first electrode and second electrode and the plurality of channels extends through the insulating material from the first side to the second side. The plurality of longitudinal channels are typically present such that a specific volume of the scaffold dielectric has a solid volume fraction of less than about 98%, typically less than 80%. In a typical embodiment, the liquid within the pores of the porous material has an ionic strength of at least 0.1 where the ionic strength is a function of the concentration of all cations and anions present in the liquid. In operation and generally, capacitance results from the migrations of positive and negative ions in the confined liquid in response to an applied electric field. Additionally disclosed is a method of supplying power to a load using the capacitor, and a method of making the capacitor.

Accordingly, this description provides exemplary embodiments of the present invention. The scope of the present invention is not limited by these exemplary embodiments. Numerous variations, whether explicitly provided for by the specification or implied by the specification or not, may be implemented by one of skill in the art in view of this disclosure.

It is to be understood that the above-described arrangements are only illustrative of the application of the principles of the present invention and it is not intended to be exhaustive or limit the invention to the precise form disclosed. Numerous modifications and alternative arrangements may be devised by those skilled in the art in light of the above teachings without departing from the spirit and scope of the present invention. It is intended that the scope of the invention be defined by the claims appended hereto.

In addition, the previously described versions of the present invention have many advantages, including but not limited to those described above. However, the invention does not require that all advantages and aspects be incorporated into every embodiment of the present invention.

All publications and patent documents cited in this application are incorporated by reference in their entirety for all purposes to the same extent as if each individual publication or patent document were so individually denoted.

TABLE 1

Thin Membrane Hole Configuration Test Matrix

| Hole Diameter (mm) | Number of Holes | % Effective Area (PEA) |
|---|---|---|
| 2.5 | 4 | 4.9 |
| 2.5 | 9 | 11.0 |
| 2.5 | 16 | 9.6 |
| 0.1 | ~5900 | 46.5 |
| 2.5 | ≈FCC packing* | 63.7 |

*Typical FCC packing densities for atoms are approximately 74%. However, due to the practical limitations of the laser cutter and general mechanical structure of the plastic insert, the highest measured PEA for this "FCC packing" design was ≈63.7%

TABLE 2

Thin Membrane Hole Configuration Test Matrix

| Test Number | Charge Rate [ma] | Discharge Rate [ma] |
| --- | --- | --- |
| 1 | 2 | 2 |
| 2 | 3 | 3 |
| 3 | 5 | 5 |
| 4 | 10 | 10 |
| 5 | 15 | 15 |
| 6 | 25 | 25 |
| 7 | 40 | 40 |
| 8 | 60 | 60 |
| 9 | 75 | 75 |

What is claimed is:

1. A capacitor comprising:
    a first electrode;
    a second electrode; and
    a scaffold dielectric in contact with the first electrode and the second electrode, the scaffold dielectric comprising:
        an insulating material comprising a first side and a second side where the first side is in contact with the first electrode and the second side is in contact with the second electrode; and
        a plurality of longitudinal channels, where every individual longitudinal channel in the plurality of longitudinal channels comprises a first aperture in the first side of the insulating material and a second aperture in the second side of the insulating material; and
        a dielectric paste within each longitudinal channel in the plurality of longitudinal channels, where the dielectric paste within the each longitudinal channel is in contact with the first electrode and the second electrode, and where the dielectric paste comprises:
            a porous material comprising pores; and
            a liquid comprising ions within the pores of the porous material.

2. The capacitor of claim 1 where the insulating material comprises a constituent material having a conductivity less than $10^{-8}$ S/cm and where the first electrode and the second electrode comprise a conductive material having conductivity greater than $10^3$ S/cm.

3. The capacitor of claim 2 where the liquid has an ionic strength of at least 0.1.

4. The capacitor of claim 3 where the ions comprise cations and anions and where the cations have an ionic concentration of at least 0.1 moles per liter of liquid and where the anions have an ionic concentration of at least 0.1 moles per liter of liquid.

5. The capacitor of claim 4 where the first electrode has a first redox potential $E_1^o$ under standard conditions, the second electrode has a second redox potential $E_2^o$ under standard conditions, the cations have a positive ion redox potential $E_+^o$ under standard conditions, and where an absolute value of $E_+^o$ divided by $E_1^o$ is greater than 0.95 and an absolute value of $E_+^o$ divided by $E_1^o$ is greater than 0.95.

6. The capacitor of claim 3 where a particular volume of the scaffold dielectric comprises some portion of the first side of the insulating material, comprises some portion of the second side of the insulating material, comprises the plurality of longitudinal channels, and comprises some portion of the insulating material, and where the particular volume of the scaffold dielectric has a solid volume fraction of less than 98%.

7. The capacitor of claim 6 where a 1 cm² area comprising some portion of the first side of the insulating material comprises at least 10 first apertures and where a 1 cm² area comprising some portion of the second side of the insulating material comprises at least 10 second apertures.

8. The capacitor of claim 1 where the liquid comprises a solvent and a solute and where the solute has a molarity of at least 0.1 moles solute per liter of solvent.

9. The capacitor of claim 8 where the solvent is a polar liquid having a dielectric constant of at least 5.

10. The capacitor of claim 9 where the porous material has a surface area greater than 0.5 m² of surface/gram of the porous material.

11. The capacitor of claim 10 where the first electrode and the second electrode are separated by a thickness t from the first electrode to the second electrode, and where the pores comprising the porous material have a mean pore diameter of less than 10% of the thickness t, and where the porous material comprises a plurality of particles where each particle in the plurality has a mean pore diameter is greater than or equal to 1 Å and less than or equal to 200,000 Å.

12. The capacitor of claim 11 where the solute is a salt, an acid, or a base.

13. The capacitor of claim 11 where the polar liquid has at least a 10% saturation of the solute in the solvent.

14. A method of supplying power to a load using the capacitor of claim 1 comprising
    applying a first voltage to the first electrode and a second voltage to the second electrode, where a difference between the second voltage and the first voltage is less than a breakdown voltage of the liquid comprising ions within the plurality of longitudinal channels of the scaffold dielectric, thereby generating a charged capacitor; and
    electrically connecting the charged capacitor to the load and discharging the charged capacitor to the load, thereby supplying power to the load.

15. A method of making the capacitor of claim 1 comprising:
    generating a pre-pressed structure by:
        contacting the second side of the insulating material and the second electrode;
        contacting the dielectric paste and each first aperture of every single longitudinal channel in the plurality of longitudinal channels; and
        contacting the first side of the insulating material and the first electrode;
    compressing the pre-pressed structure using a compressive force to displace the first electrode toward the second electrode and the second electrode and place the first side of the insulating material in contact with the first electrode and the second side of the insulating material in contact with the second electrode, and place the dielectric paste in contact with the with the first electrode and the second electrode through the every single longitudinal channel in the plurality of longitudinal channels, thereby placing the first side of the insulating material in contact with the first electrode and the second side of the insulating material in contact with the second electrode and thereby placing the dielectric paste within the each longitudinal channel in contact with the first electrode and the second electrode, and thereby making the capacitor.

16. The method of claim 15 further comprising:
    utilizing a particular material for the insulating material where the particular material comprises constituent material having a conductivity less than $10^{-8}$ S/cm;
    utilizing a particular liquid for the liquid where the particular liquid has an ionic strength of at least 0.1.

17. A capacitor comprising:
a first electrode;
a second electrode; and
a scaffold dielectric in contact with the first electrode and the second electrode, the scaffold dielectric comprising:
an insulating material comprising a first side and a second side where the first side is in contact with the first electrode and the second side is in contact with the second electrode; and
a plurality of longitudinal channels, where every individual longitudinal channel in the plurality of longitudinal channels comprises a first aperture in the first side of the insulating material and a second aperture in the second side of the insulating material, and the plurality of longitudinal channels are present in the scaffold dielectric such that a particular volume of the scaffold dielectric comprising some portion of the first side of the insulating material, some portion of the second side of the insulating material, the plurality of longitudinal channels, and some portion of the insulating material has a solid volume fraction of less than 98%; and
a dielectric paste within each longitudinal channel in the plurality of longitudinal channels, where the dielectric paste within the each longitudinal channel is in contact with the first electrode and the second electrode, and where the dielectric paste comprises:
a porous material comprising pores, where the porous material has a surface area greater than 0.5 $m^2$ of surface/gram of the porous material; and
a liquid comprising ions within the pores of the porous material, where the liquid comprises a solvent and a solute and where the solute has a molarity of at least 0.1 moles solute per liter of solvent and the solvent has a dielectric constant of at least 5.

18. The capacitor of claim 17 where the insulating material comprises a constituent material having a conductivity less than $10^{-8}$ S/cm and where the first electrode and the second electrode comprise a conductive material having conductivity greater than $10^3$ S/cm.

19. The capacitor of claim 18 where the solute is a salt, an acid, or a base.

20. The capacitor of claim 19 where the polar liquid has at least a 10% saturation of the solute in the solvent.

* * * * *